United States Patent [19]

Alexander et al.

[11] Patent Number: 5,095,300
[45] Date of Patent: Mar. 10, 1992

[54] DEVICE FOR SENSING SIDE POSITIONING OF WAFERS

[75] Inventors: David V. Alexander, Elk Grove; Gary T. George, Rocklin, both of Calif.

[73] Assignee: NEC Electronics Inc., Mountain View, Calif.

[21] Appl. No.: 502,145

[22] Filed: Mar. 28, 1990

[51] Int. Cl.5 .............................................. G01B 11/00
[52] U.S. Cl. .................................... 340/686; 340/568; 356/373
[58] Field of Search .......................... 250/491.1, 492.2; 269/54, 54.5; 315/111.81; 414/754, 936; 901/47; 73/864.91; 340/568, 686; 356/373, 387

[56] References Cited

U.S. PATENT DOCUMENTS 4,787,814 11/1988 Vaerman .......................... 414/754 X

FOREIGN PATENT DOCUMENTS 204461 11/1983 Japan ............................. 315/111.81
245221 12/1985 Japan ................................ 250/492.2
62-47940 3/1987 Japan ............................... 250/491.1

Primary Examiner—David A. Bucci
Assistant Examiner—Janice Krizek
Attorney, Agent, or Firm—Skjerven, Morrill, MacPherson, Franklin & Friel

[57] ABSTRACT

An apparatus is provided which determines whether a member is placed correctly on a base. The apparatus comprises an arm mounted for movement toward and away from the base which normally holds the member in place on the base. The arm has a projection which extends a distance beyond the surface of the arm and toward the base. When the member is in a first or third position relative to the base, the projection makes contact with the member. When the member is in a second position relative to the base, the projection clears the member and is positioned in close proximity to the side of the base. The apparatus determines the position of the member by sensing with a photosensor a corresponding position of the arm displaced from the base. The displacement distance of the arm relative to the base is due to the distance that the projection extends beyond the surface of the arm.

13 Claims, 10 Drawing Sheets

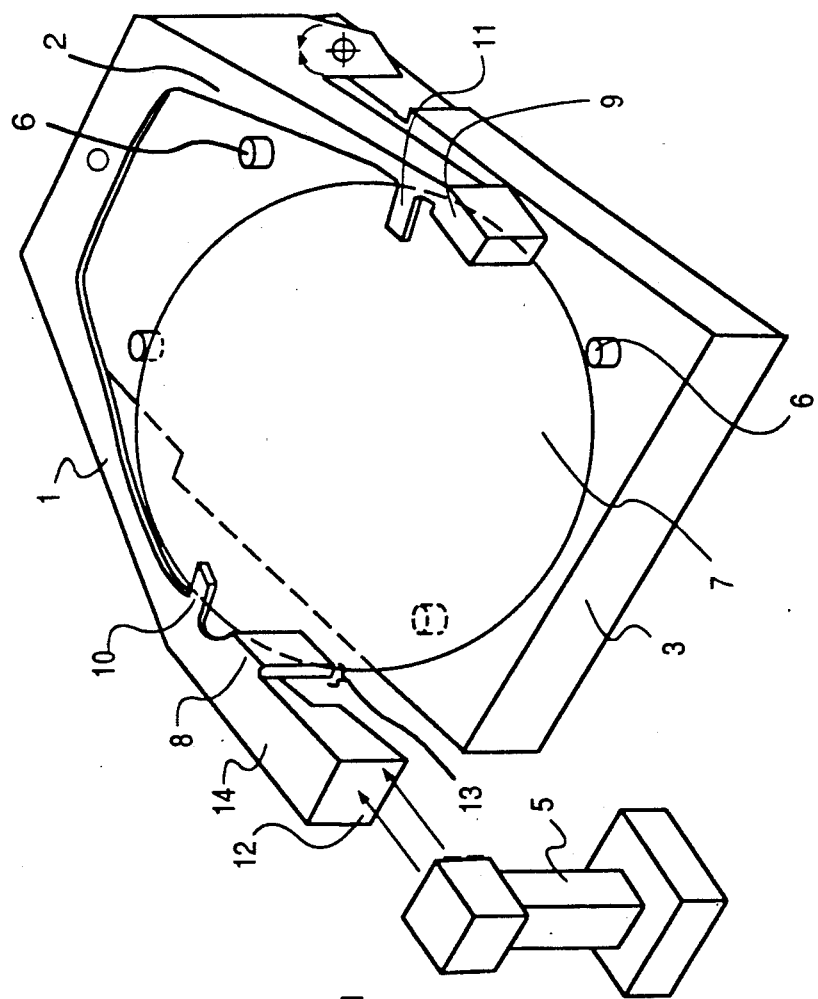
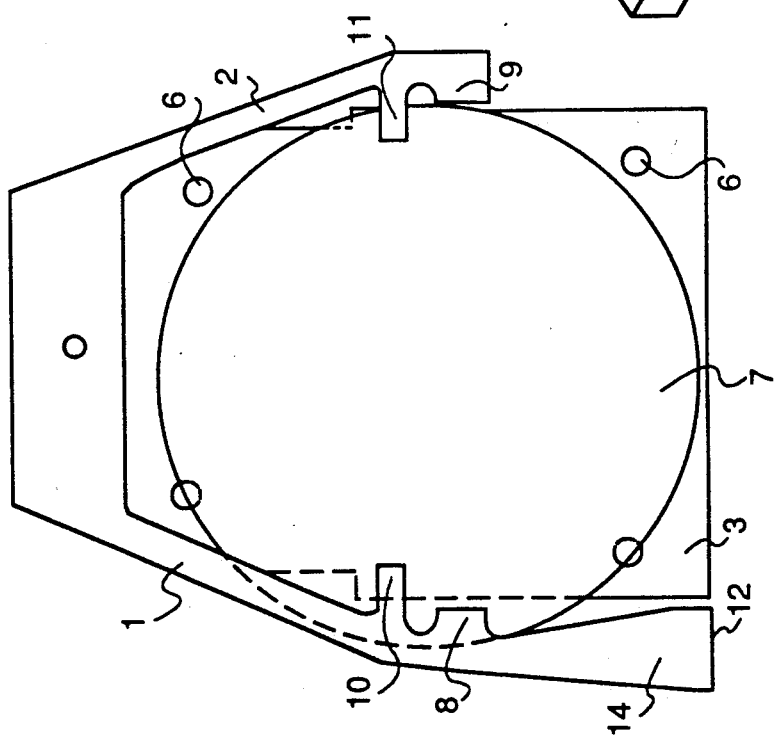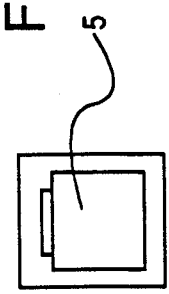

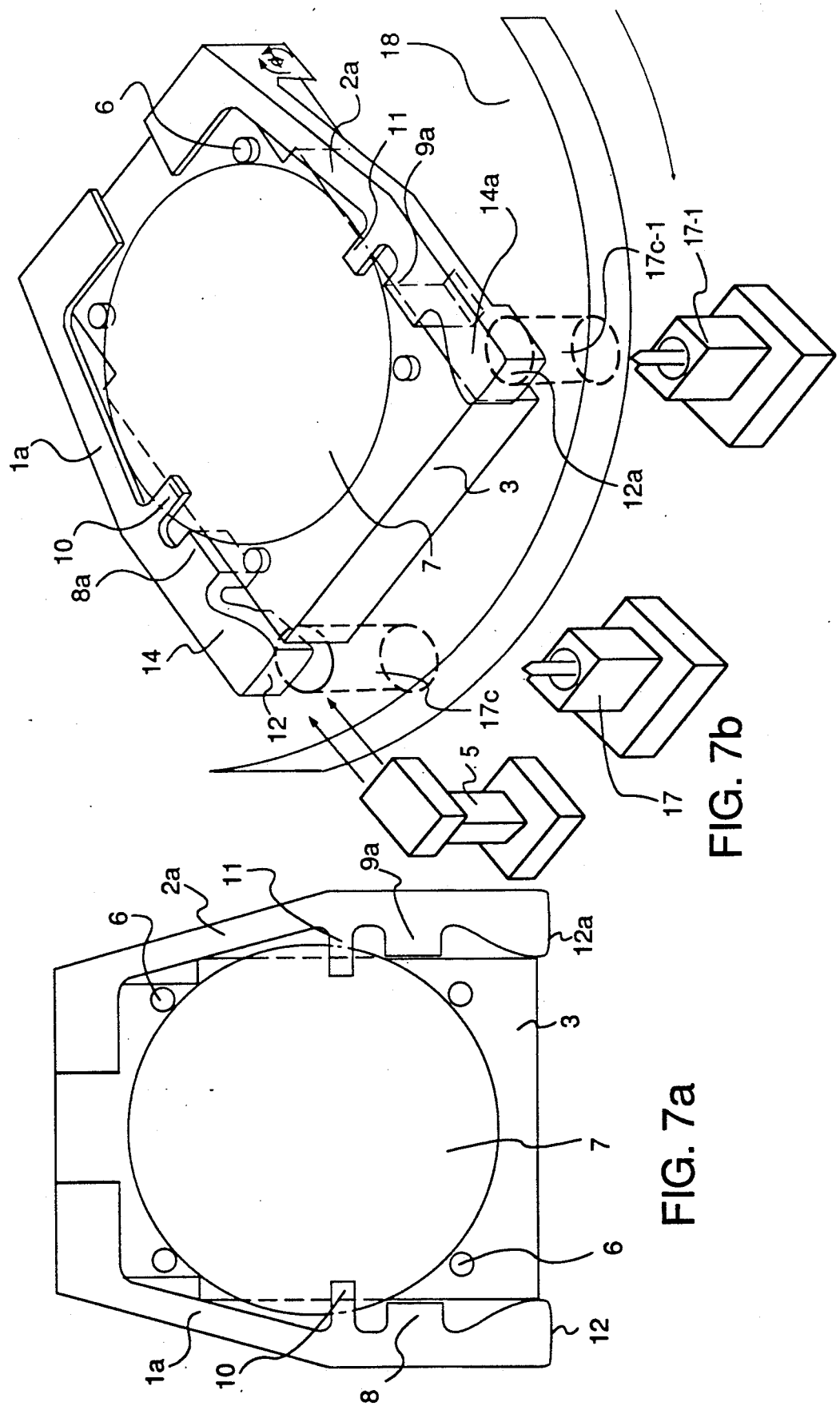

DEVICE FOR SENSING SIDE POSITIONING OF WAFERS

BACKGROUND OF THE INVENTION

1. Field of the Invention

This invention relates to a means for detecting the relative positioning of a member, such as a wafer, on a support base, and is especially adaptable to ion implantation equipment.

2. Description of the Prior Art

State of the art ion implantation equipment has automatic wafer pick-up-and-place capability using robotics. State of the art ion implantation equipment includes the NV Series Ion Implanters, manufactured by Eaton Corporation, for example. Typically, one robotic arm will pick up wafers from a wafer cassette and position the wafers on a rotating table or disk before the implantation process. Another robotic arm is typically provided to remove the wafers from the disk and place the wafers onto another wafer cassette after the ion implantation process is completed. The wafer is held in place on a base within a set of retaining pins by a clamping arm which is pivotally connected to and movable toward and away from the base. A clamping arm is necessary to secure the wafers because the disk rotates during the ion implantation process at least 1,000 rpms. In order for wafers to be positioned on the disk and within the retaining pins on the base, the clamping arm must be moved away from the base. Movement of the clamping arm is typically actuated by a pneumatically-controlled clamp lifter. The clamp lifter comprises an air cylinder and a vertically movable elongated plunger. Air causes the plunger to move out of the air cylinder and through a slot located through the disk at a position which is aligned with the clamping arm. The plunger contacts the bottom side of the clamping arm, thereby causing the clamping arm to move away from the base as the plunger continues its vertical movement out of the air cylinder.

A great degree of accuracy is necessary to position the wafers within the set of retaining pins because the retaining pins are so located relative to each other such that a wafer only has minimum freedom of movement within the pins after the wafer has been placed. To that end, robotic arms fail to consistently achieve the degree of accuracy necessary. Therefore, a means for detecting when a robot arm fails to properly position a wafer within the set of retaining pins is necessary. The most common conventional means for detecting the relative positioning of a wafer on ion implantation equipment, such as the NV Series Implanters, uses a fixed photosensor to detect light when a wafer is mispositioned by the robotic arm. During proper operation, a robot arm picks up and places a wafer 20 into position on a base 21 within a set of retaining pins 22, as illustrated in FIGS. 1a, b. The retaining pins 22 protrude up vertically from base 21. A clamping arm 23 is pivotally connected to base 21 for movement toward and away from base 21. After the wafer 20 is placed by the robot arm, clamping arm 23 is moved toward base 21 to make contact with wafer 20 at points 26, 27 thereby clamping wafer 20 in place. A fixed photosensor 24 is provided which is mounted on a different base than wafer mounting base 21 and is shown in FIG. 1b. Photosensor 24 emits light in a continuous path. When wafer 20 is properly placed and clamping arm 23 clamps the wafer in place, end face 25 of clamping arm 23 is lower than the light path of photosensor 24. As long as the light path is undisturbed, the wafer pick-up and placement operation will continue.

Frequently, the equipment fails to operate properly because the robot arm is prone to drift out of adjustment and as a consequence, the robot arm improperly places wafer 20 onto the retaining pins 22 to some extent, as illustrated in FIG. 2a. Clamping arm 23 will sit higher on wafer 20 at one of the clamping points 26 when wafer 20 is improperly placed than when wafer 20 is properly placed within the retaining pins 22. Photosensor 24 should detect the improper placement because clamping arm 23 should be high enough to disturb the fixed light path, thereby reflecting some light back into photosensor 24. If clamping arm 23 disturbs the light path and photosensor 24 detects some light reflected off of end face 25 of clamping arm 23, it signals the robot arm to halt the wafer placement operation, thereby signifying a wafer has been improperly placed onto the retaining pins 22. In practice, clamping arm 23 may not disturb the continuous light path when wafer 20 is improperly placed onto retaining pins 22, because clamping arm 23 is not raised high enough to ensure that the light path is disturbed and some light is reflected into photosensor 24, as illustrated in FIG. 2b. Therefore, photosensor 24 will not signal the robot arm to halt its operation. Incidences such as this are attributable to machining runout and the tolerance levels achieved during machining component parts of the equipment, such as base 21, retaining pins 22, and clamping arm 23 and includes the eccentricity in the base 21 rotating mechanisms. These tolerance levels can be much greater than the displacement distance of clamping arm 23 when wafer 20 is improperly placed. Therefore, a displaced clamping arm 23 under these circumstances is frequently undetected by photosensor 24. As a result, an improperly placed wafer 20 left undetected causes destruction and disintegration of the wafers and spreads wafer particles throughout the process chamber during subsequent wafer processing. Downtime due to undetected mispositioned wafers could be up to 30 hours in a manufacturing/processing facility and could incur tremendous costs.

SUMMARY OF THE INVENTION

It is therefore an object of this invention to provide a means for ensuring the detection of improperly placed members, such as wafers, regardless of the extent of their improper placement. According to the present invention, an apparatus is provided to accentuate the positioning of a member when the member is improperly placed on a base. The apparatus includes a clamping arm connected to a base for movement toward and away from the base. The clamping arm has a projection extending beyond the surface of the arm and toward the base. When the member is in a first position relative to the base, the projection comes into contact with the member as the arm is moved toward the base. When the member is in a second position relative to the base, the projection is positioned in close proximity to a side of the base as the arm is moved toward the base. The position of the member relative to the base is determined when the corresponding position of the arm relative to the base is detected by a fixed photosensor. The location of the arm when in the first position is substantially displaced from the location of the arm when in the second position. The displacement distance is directly related to the distance that the projection extends beyond the surface of the arm. The displacement distance of the clamping arm relative to the base is increased significantly by the projection and is therefore more readily detectable by the fixed photosensor.

BRIEF DESCRIPTION OF THE DRAWINGS

FIG. 1b is a side view of the conventional apparatus in FIG. 1a.

FIG. 2a is a top view of the conventional apparatus illustrating when a wafer is improperly placed.

FIG. 2b is a side view of the conventional apparatus in FIG. 2a.

FIG. 3b is a side view of the preferred embodiment in FIG. 3a.

FIG. 4a is a top view of the preferred embodiment illustrating when the member is improperly placed toward clamping arm member 1.

FIG. 4b is a side view of the preferred embodiment in FIG. 4a.

FIG. 6b is a side view of the preferred embodiment in FIG. 6a.

FIG. 7a is a top view of another embodiment of the present invention.

FIG. 7b is a side view of the embodiment in FIG. 7a.

FIG. 7c is a side view illustrating a variation in the embodiment in FIG. 7a.

FIG. 8a is a top view of still another embodiment of the present invention.

FIG. 8b is a side view of the embodiment in FIG. 8a.

DETAILED DESCRIPTION OF THE INVENTION

Figure 1B:
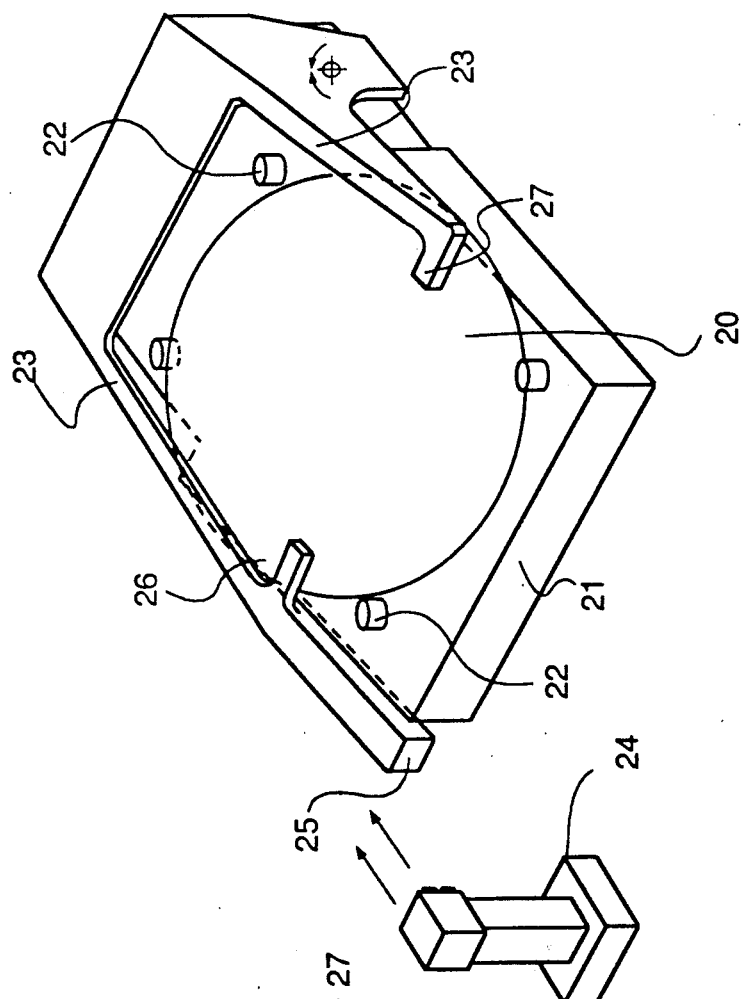
Figure 1A:
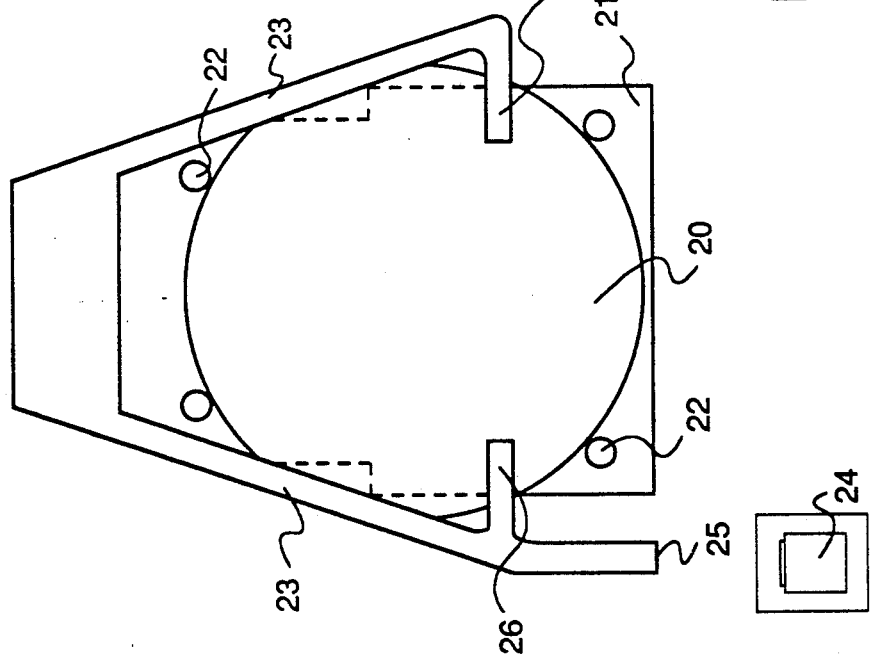
FIG. 1a is a top view of the conventional apparatus illustrating when a wafer is properly placed.
Figures 2A, 2B:
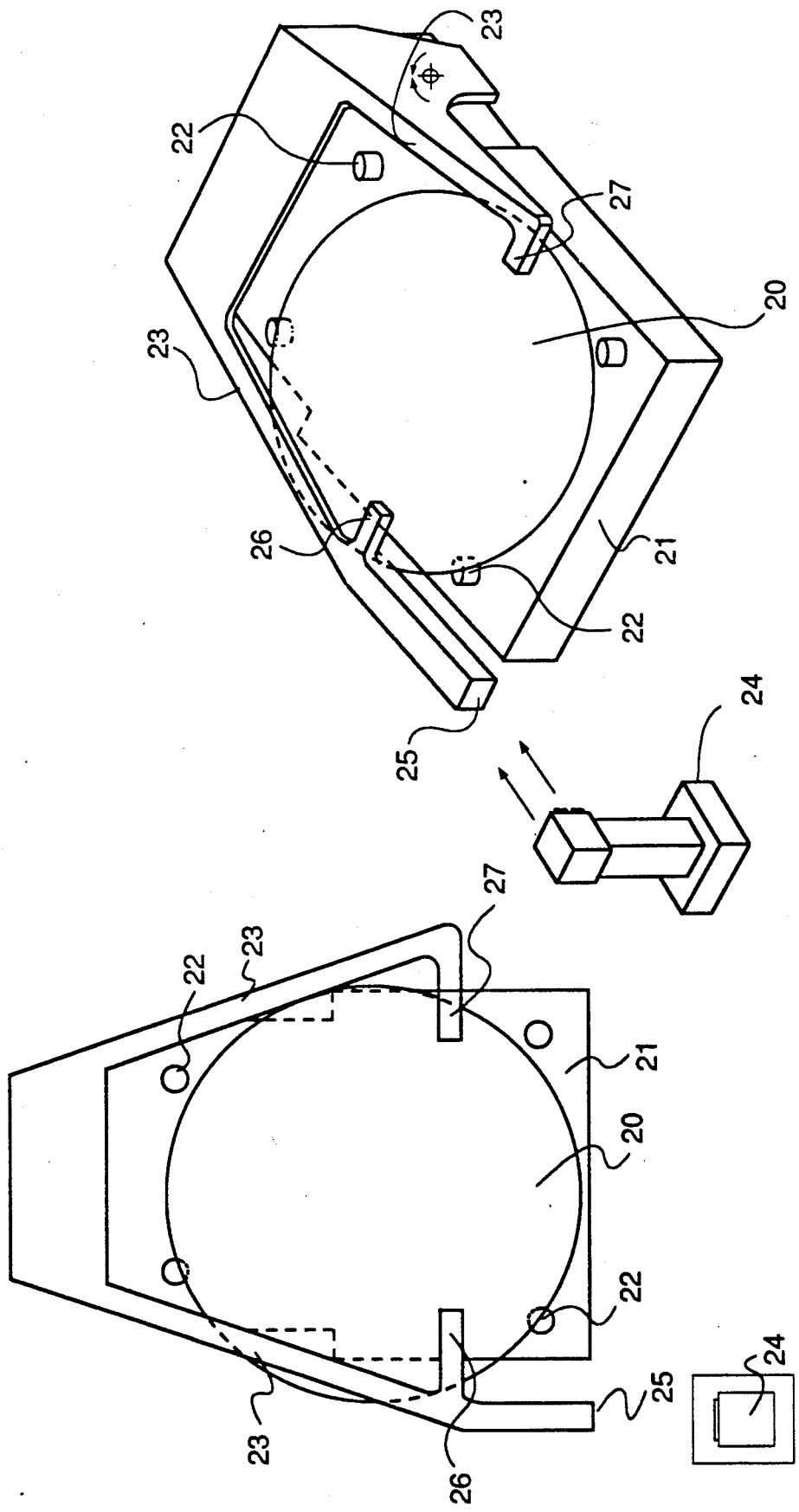
Figure 3B:
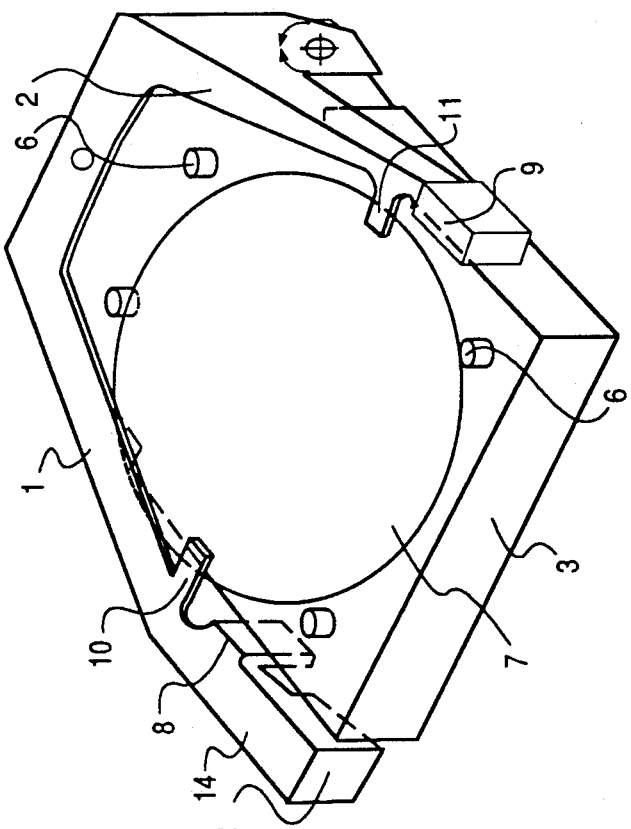
Figure 3A:
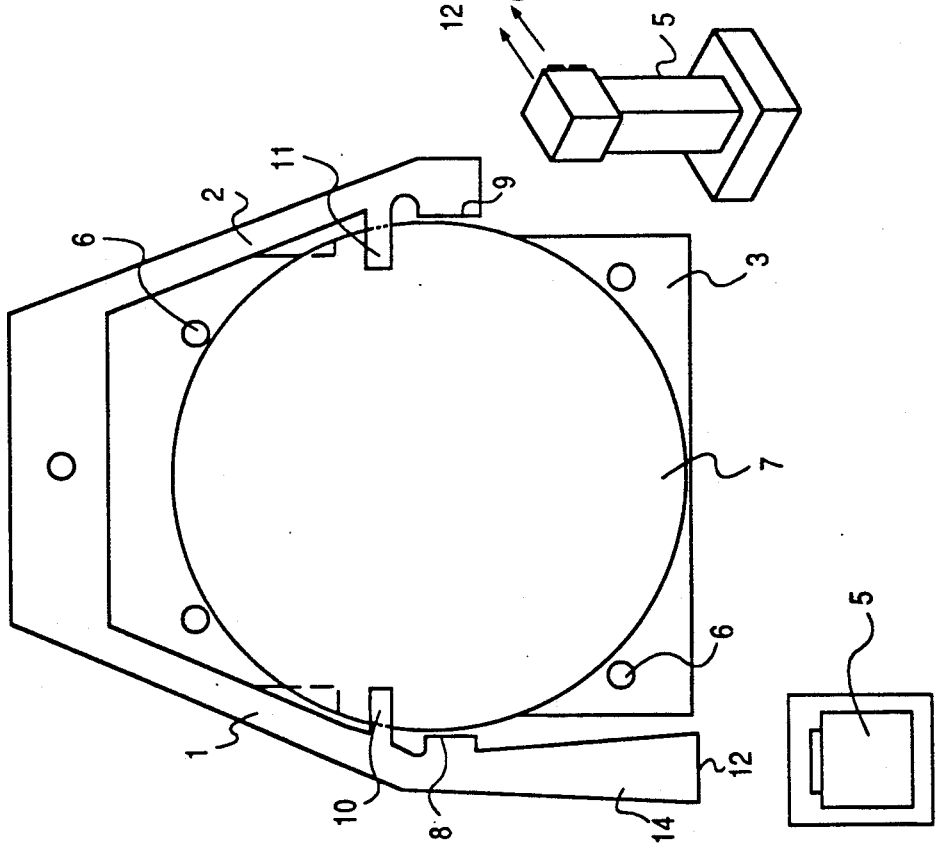
FIG. 3a is a top view of a preferred embodiment of the present invention illustrating when a member is properly placed.
Figure 5:
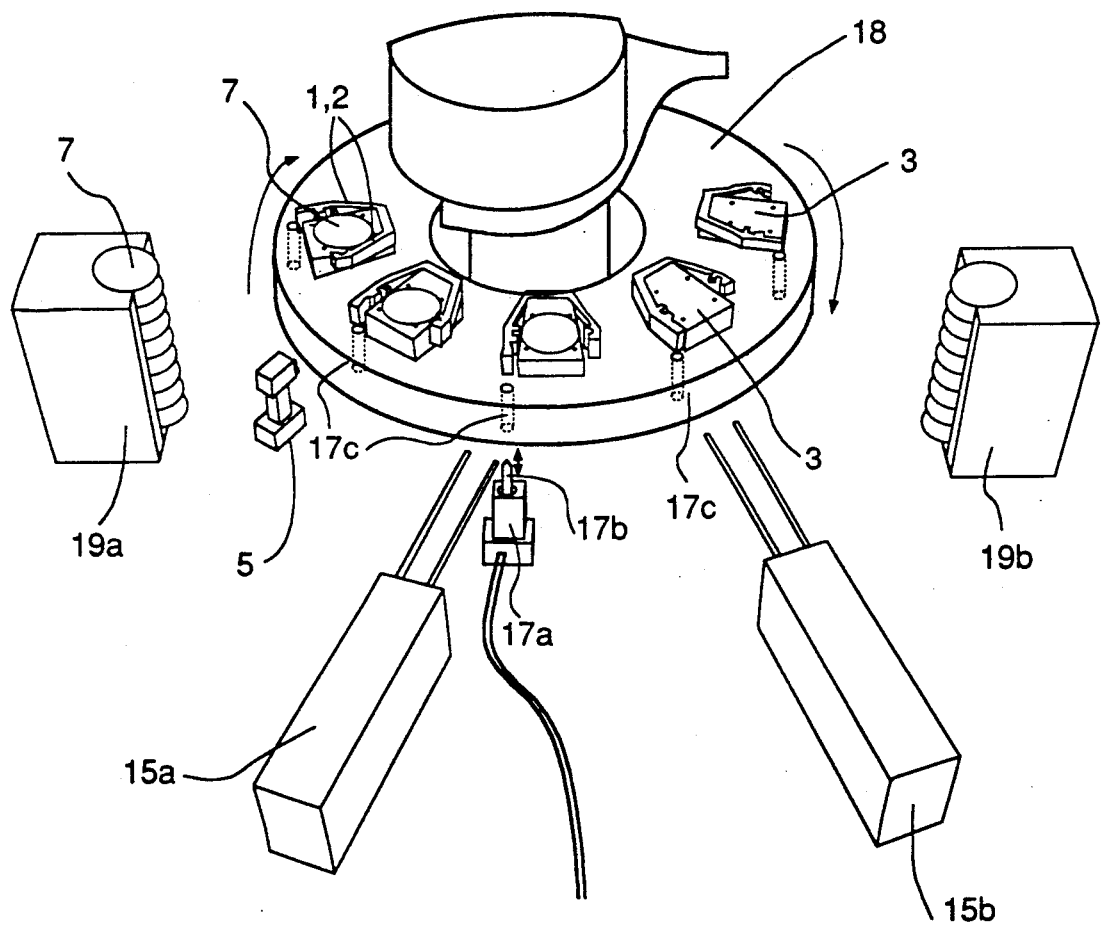
FIG. 5 illustrates the present invention incorporated on a wafer transfer system.
Figure 6B:
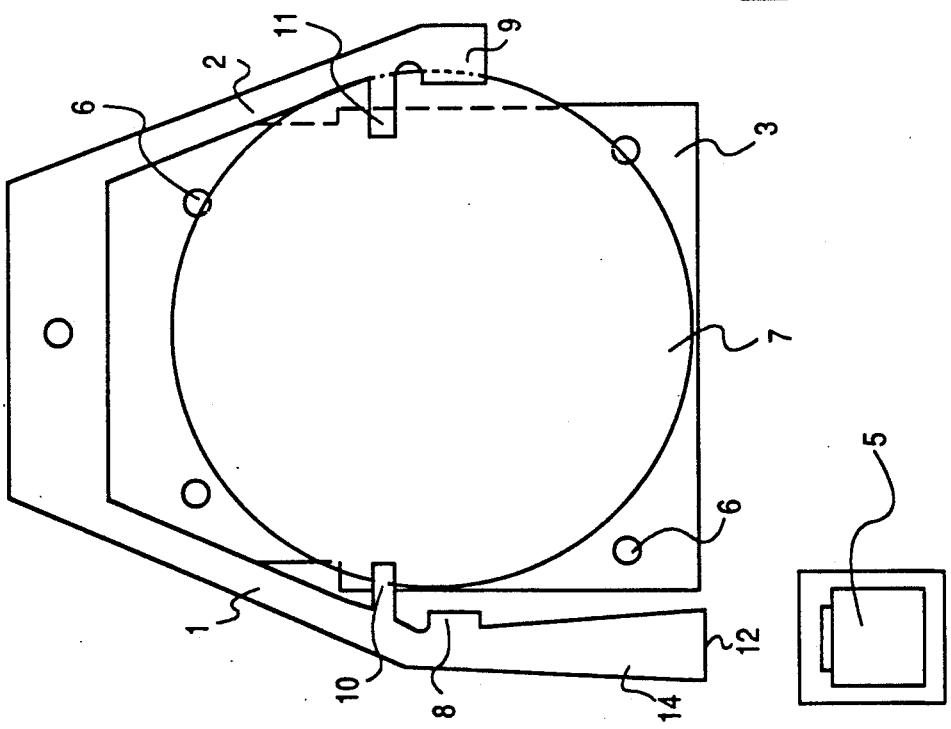

The apparatus of the present invention is illustrated in FIGS. 3a, b; 4a, b; 6a, b; and 7a, b. A clamping arm having two members 1, 2 is pivotally connected to a base 3. Clamping arm 1, 2 moves toward and away from base 3. Base 3 has a predetermined thickness and a plurality of retaining pins 6 within which a member 7, such as a wafer, may be placed. Retaining pins 6 extend vertically up from base 3 and can be at least as high as member 7 is thick. Base 3 is narrower than the width of member 7 so that member 7 overhangs the sides of base 3. Base 3 is located on disk 18 and disk 18 is rotatable relative to robot arms 15a, b and a photosensor 5, as illustrated in FIG. 5. Also illustrated in FIG. 5 is clamp lifter 17 attached to a base different from base 3. Clamp lifter 17 comprises an air cylinder 17a which encloses plunger 17b therein. Air from air cylinder 17a causes plunger 17b to move out of air cylinder 17a and through slot 17c. Slots 17c extend completely through disk 18 (shown by dotted lines) and are positioned under clamping arm members 1. When plunger 17b moves through slot 17c, it contacts clamping arm member 1 on an under-surface and causes clamping arm 1, 2 to move away from the base. When clamping arm 1, 2 is moved away from base 3, robot arm 15a picks up member 7 from cassette 19a and places member 7 onto base 3, or robot arm 15b picks up member 7 from base 3 and places member 7 in cassette 19b, depending on whether disk 18 is being loaded or unloaded. In a preferred embodiment, clamping arm 1, 2 extends along opposite sides of base 3. As illustrated in FIGS. 3a and 3b, clamping arm 1, 2 has clamp points 10, 11 which project out radially toward each other and serve to hold member 7 in place when clamping arm 1, 2 is moved toward base 3. Clamping arm 1, 2 has projections 8, 9 which extend beyond the surface of clamping arm 1, 2, respectively, and toward base 3. When member 7 is placed in a second position, as illustrated in FIGS. 3a, b, clamping arm 1, 2 rests on member 7 at clamping points 10, 11. Projections 8, 9 extend in close proximity to opposite sides of base 3. When member 7 is placed into a first or third position, as illustrated in FIGS. 4a, b and 6a, b, respectively, projection 8 or 9 will not clear the edge of member 7. In the preferred embodiment, the first and third positions represent an improperly placed wafer 7 onto retaining pins 6 and the second position represents a properly placed wafer 7 within retaining pins 6. FIG. 4b illustrates an interference point 13 created by member 7 being in a first position causing clamping arm member 1 to contact member 7 at projection 8. The distance between clamping arm member 1 and base 3 when member 7 is in the first position (as in FIG. 4b) is substantially different from the distance of clamping arm member 1 and base 3 when member 7 is in a second position (as in FIG. 3b). The displacement distance between clamping arm member 1 when wafer 7 is improperly placed is significantly increased over that of the prior art and is due to the distance that projection 8 extends beyond the surface of clamping arm member 1. As a result, the displacement distance of clamping arm member 1 when wafer 7 is improperly placed is always much greater than the variable tolerances achievable during the machining of base 3, clamping arm 1, machining runout and eccentricity in the disk rotating mechanisms (located immediately below disk 18, FIG. 5), and retaining pins 6 as mentioned previously. In the preferred embodiment, it is also preferable that at least one clamping arm member be longer and that this longer member face photosensor 5. In FIGS. 3b, 4b, and 6b, clamping arm member 1 is longer than clamping arm member 2 and faces photosensor 5. Also, clamping arm member 1 is thicker and wider at an end 14 facing photosensor 5 than the rest of clamping arm member 1. A clamping arm face 12, which faces the photosensor 5, is cut to an angle to facilitate reflection of light from the photosensor 5 light path. This shape and end cut of the longer clamping arm member 1 further increase the capability of the present invention to overcome the shortcomings associated with the machining tolerances mentioned previously and further increase the sensitivity of the present invention to the various positions which a member 7 might be improperly placed. Therefore, light from photosensor 5 that is normally undisturbed by clamping arm member 1 face 12 when wafer 7 is properly placed within the retaining pins 6, as illustrated in FIG. 3b, is always disturbed by clamping arm member 1 and reflected into photosensor 5 from end face 12 in the situations illustrated in FIGS. 4b and 6b, wherein wafer 7 is improperly placed onto retaining pins 6. When photosensor 5 senses the reflected light due to clamping arm 1, 2 sitting higher than normal, it signals robot arm 15 to halt the wafer placement operation. The improperly placed wafer 7 can be removed and robot arm 15 can be readjusted. As a result, every wafer which is improperly placed by robot arm 15 can be detected by photosensor 5. The downtime due to undetected improperly placed wafers is minimized, and the manufacturing/processing facility incurs little additional cost.

Figure 6A:
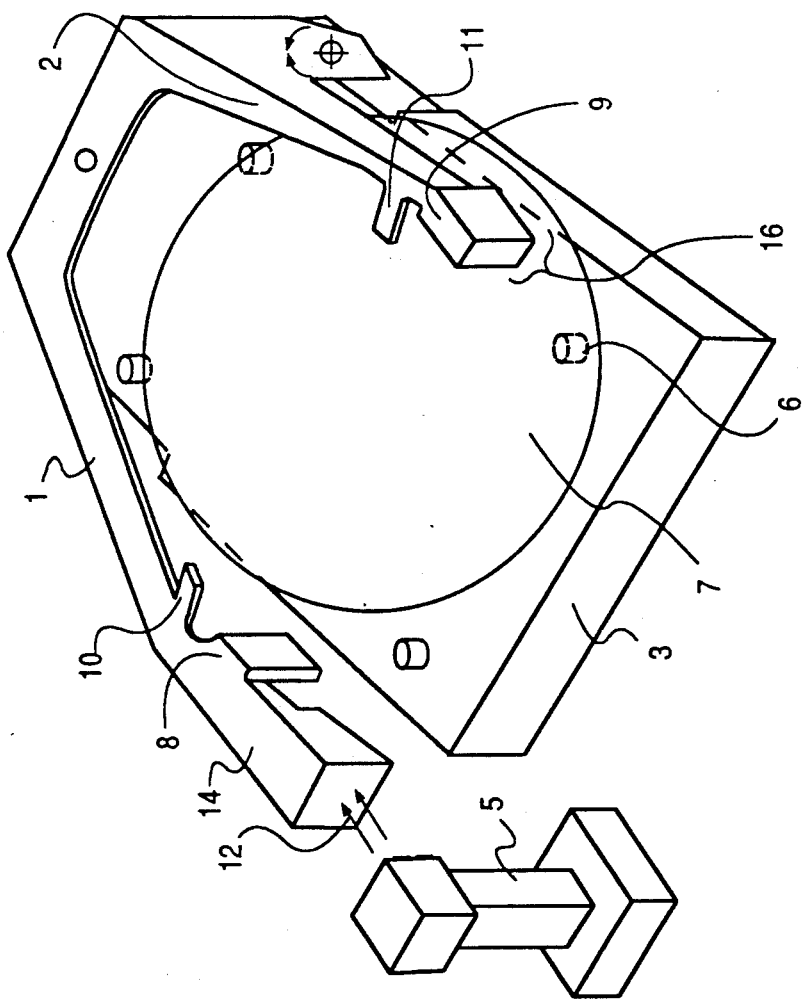
FIG. 6a illustrates the preferred embodiment when the member is improperly placed towards clamping arm member 2.

FIG. 6b illustrates the situation when member 7 is mispositioned onto retaining pins 6 and interference point 16 is created by clamping arm member 2 contacting wafer 7 at projection 9. In the preferred embodiment, clamping arm members 1, 2 are integrally connected. When clamping arm member 2 is displaced by the mispositioned wafer 7, as illustrated in FIGS. 6a, b, clamping arm member 1 is also displaced. The distance beyond the surface of clamping arm member 2 that projection 9 extends is sufficient to displace clamping arm member 1 enough to position clamping arm member 1 into the photosensor 5 light path, as illustrated in FIG. 6b. As a result, the large end face 12 of clamping arm member 1 disturbs the light and reflects the light back into photosensor 5 signifying a mispositioned wafer 7. Photosensor 5 signals robot arm 15 to halt its operation as described above.

Figure 9C:
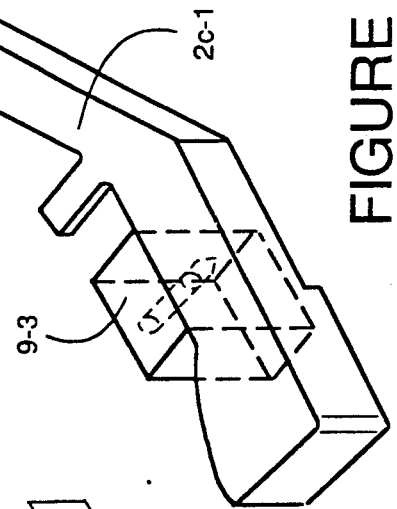
FIG. 9c is a side view illustrating the attachment of a projection according to the present invention to a clamping arm of still another embodiment.
Figure 9A:
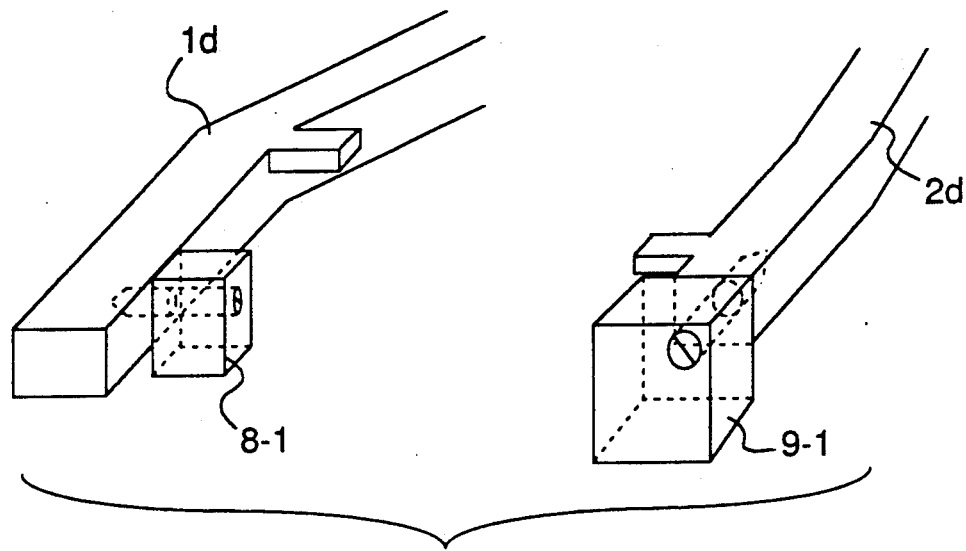
FIG. 9a is a side view illustrating the attachment of projections according to the present invention to a preexisting clamping arm of FIGS. 1a, b and FIGS. 2a, b.
Figure 9B:
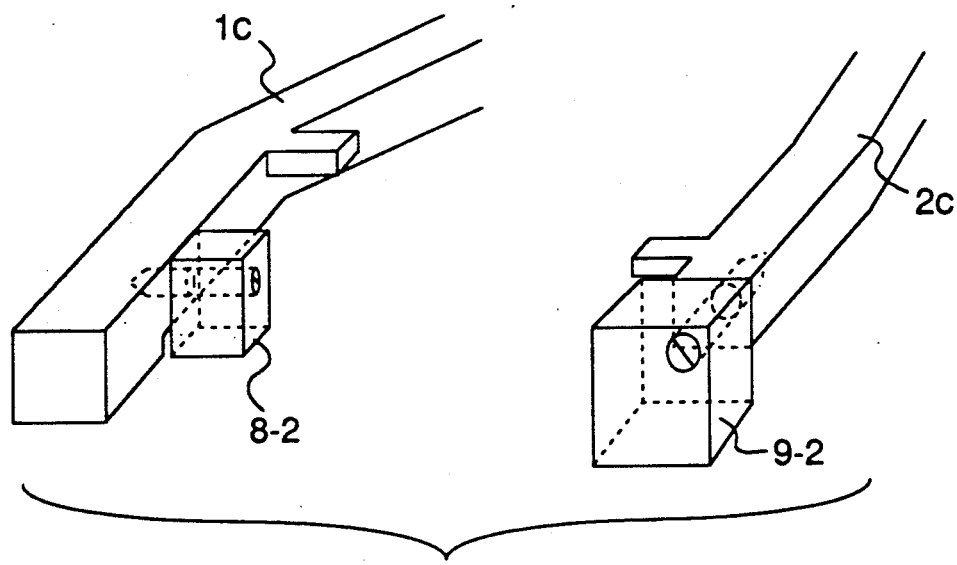
FIG. 9b is a side view illustrating the attachment of projections according to the present invention to clamping arms of still another embodiment.

Clamping arm members according to one embodiment of the present invention can be made from the existing clamping arms of the standard Eaton clamp 23, for example, as illustrated in FIG. 9a, or using clamping arm members 1c, 2c and 2c-1, as illustrated in FIGS. 9b and 9c, respectively. A hole is drilled through individual projections according to the invention for inserting a screw therethrough. A tapered hole is drilled into the existing clamping arms in a location to which the projections will be attached. The projections are individually aligned with the respective tapered hole in each clamping arm and a screw is inserted for fixably connecting the projections to the existing clamping arms. Individual projections can be made of machinable plastic or preferably metal, such as an aluminum alloy. In the preferred embodiment, clamping arm members 1, 2 are die cast with projections 8, 9 integrally connected thereto, respectively. Clamping arm members 1, 2 with projections 8, 9 integrally connected thereto are preferably die cast from metal, such as aluminum alloy. This method of manufacture is good for producing large quantities of high accuracy parts, although some machine finishing may be required.

Figure 7C:
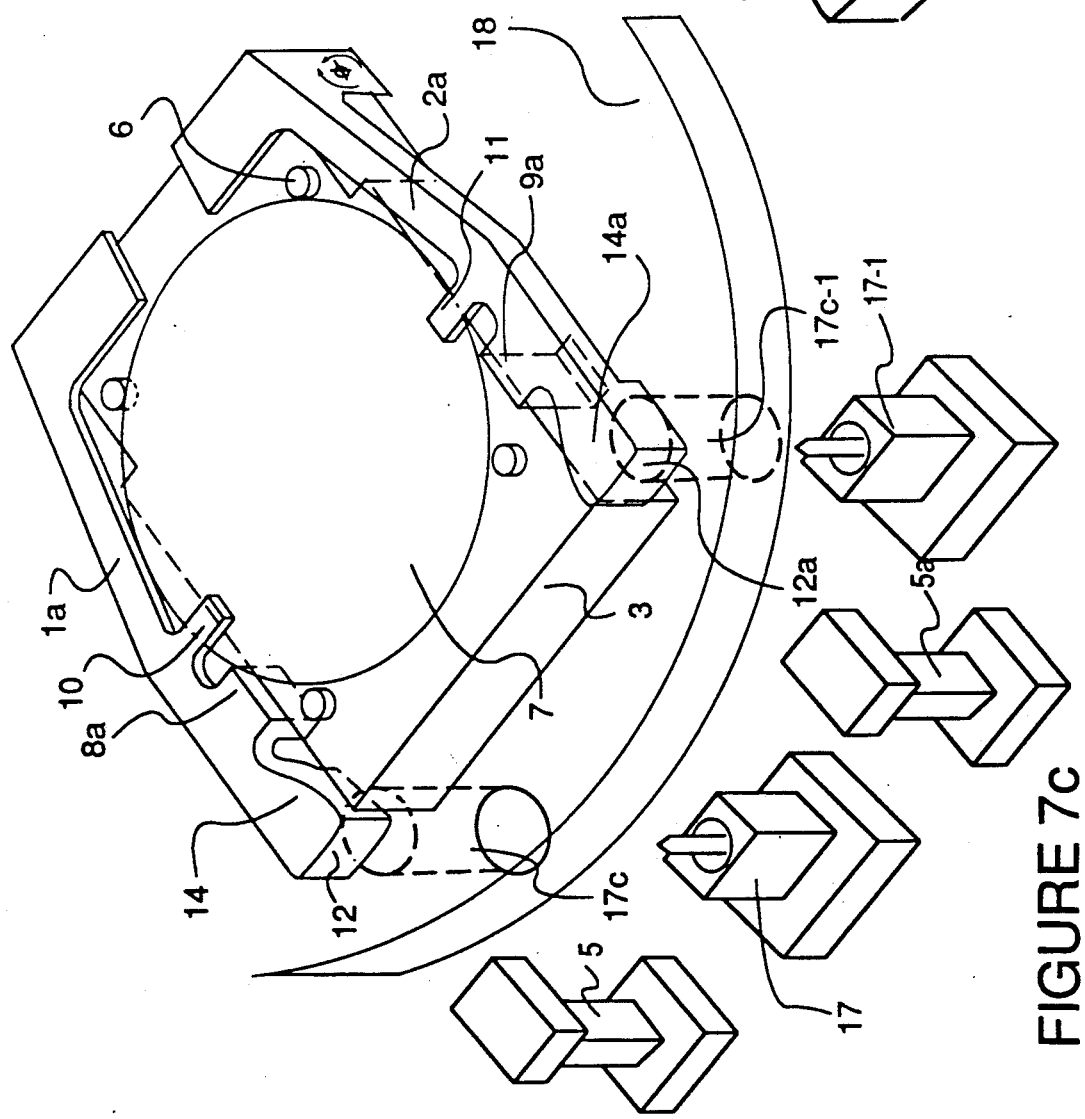
Figures 8A, 8B:
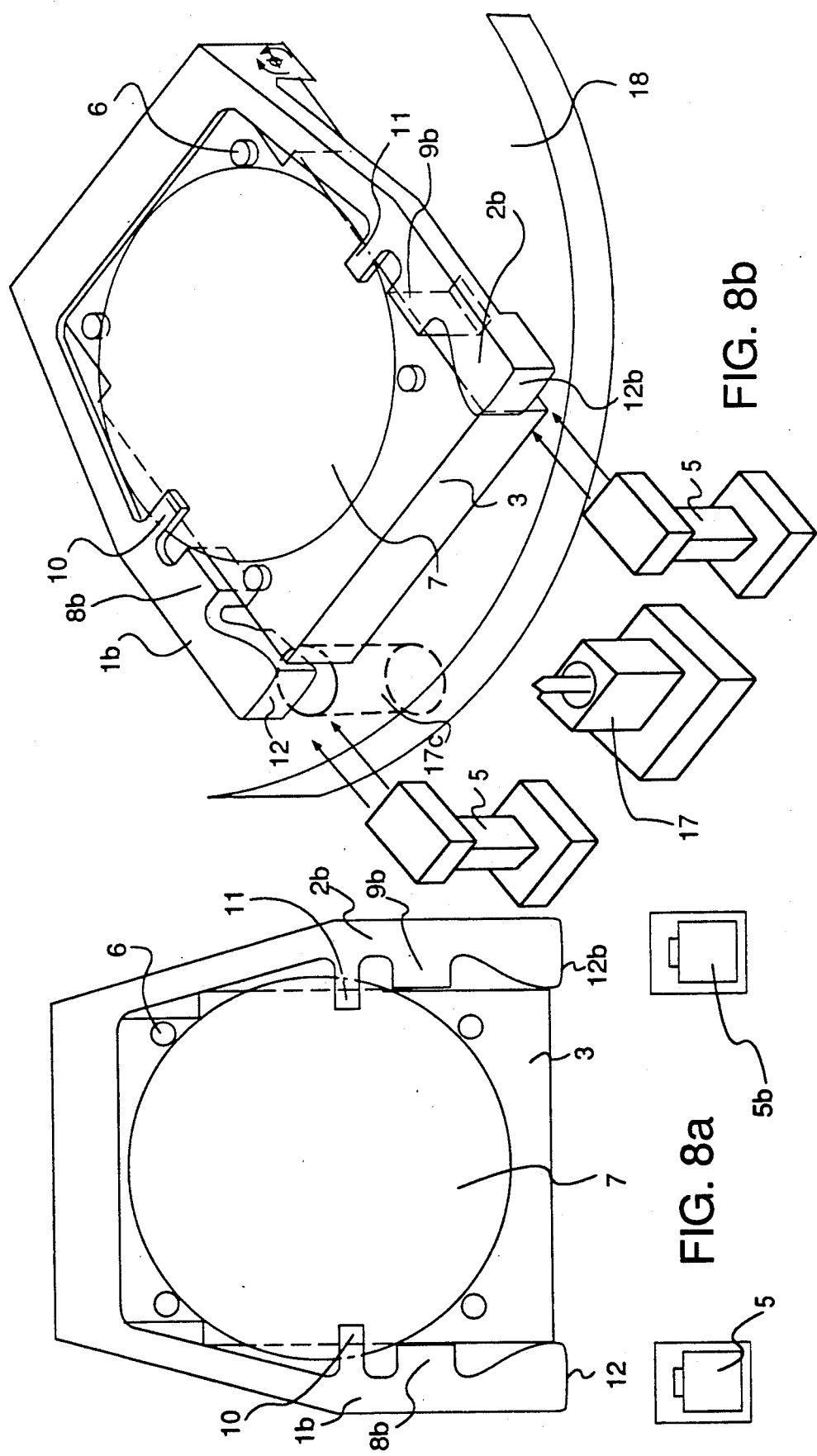

In other embodiments, the clamping arm members 1a, 2a having projections 8a, 9a may be independently movable and the same length, as illustrated in FIGS. 7a-c. Each clamping arm member 1a, 2a may have a wider and thicker end face for reflecting light from photosensor 5. Each clamping arm member 1a, 2a could be individually positioned in front of the photosensor 5 light path as disk 18 is rotated with each placement of a member 7 by robot arm 15a, as illustrated in FIG. 7b, or an additional photosensor 5a could be positioned in alignment with clamping arm member 2a, so that as each member 7 is clamped in place, each of clamping arm members 1a, 2a are simultaneously positioned in front of photosensors 5 and 5a, respectively, as illustrated in FIG. 7c. With these embodiments and their variations, as illustrated in FIGS. 7a-c, an additional clamp lifter 17-1 and slot 17c-1, similar to clamp lifter 17 and 17c, would be required to separately cause clamping arm member 2a to move away from base 3 in the same way clamp lifter 17 causes clamping arms 1, 2 to move. Therefore, each clamping arm member 1a, 2a could individually reflect light from photosensor 5, as in the embodiment illustrated in FIG. 7b, or from both photosensors 5, 5a light path(s) as in the embodiment illustrated in FIG. 7c when the respective clamping arm member is displaced by a mispositioned wafer, depending on which side that member 7 is predominantly mispositioned. In still another embodiment, the clamping arm members 1b, 2b are integrally connected and both clamping arm members 1b, 2b are the same length, width and thickness, as illustrated in FIGS. 8a, b. Only one clamp lifter 17 and slots 17c are necessary to cause clamping arm 1b, 2b to move away from base 3. Each clamping arm member 1b, 2b has a projection 8b, 9b similar to projections 8, 9 on clamping arm members 1, 2. Moreover, two photosensors 5 and 5b are provided to sense the mispositioning of a member 7 on clamping arm member 1b side or on clamping arm member 2b side, respectively. In each embodiment, the distance that the clamping arm members would be displaced would directly relate to the distance beyond the surface of that clamping arm member that the projection extends.

While the invention has been described in connection with several exemplary embodiments, it will be understood that many modifications will be apparent to those of ordinary skill in the art without going beyond the intended scope of the invention.

I claim:

1. An apparatus for sensing positions of a member relative to a base when the member is placed on the base comprising:

an arm mounted to the base, the arm being movable in a direction toward and away from the base, the arm having a projection extending a distance beyond the arm in said direction of movement of the arm toward the base and being located on the arm so that the projection comes into contact with the member as the arm is moved toward the base to determine a first position of the member relative to the base and the projection is free from contact with the member as the arm is moved toward the base to determine a second position of the member relative to the base, wherein the member in its first position causes the arm to occupy a detectable displaced position relative to the base, the displaced position of the arm being substantially displaced from a nondisplaced position that the arm occupies when the member is in its second position, the displacement being directly related to the extending distance and location of the projection.

2. The apparatus according to claim 1, further comprising:

a second arm disposed opposite to the arm, the second arm being mounted to the base and being movable in said direction toward and away from the base, the second arm having a second projection extending a distance beyond the second arm in said direction of movement of the second arm toward the base and being located on the second arm so that the second projection comes into contact with the member as the second arm is moved toward the base to determine a third position of the member relative to the base and the second projection is free from contact with the member as the second arm is moved toward the base to determine the second position of the member relative to the base, wherein the third position of the member causes the second arm to occupy a detectable displaced position relative to the base, the displaced position of the second arm being substantially displaced from a nondisplaced position that the second arm occupies when the member is in its second position, the displacement being directly related to the extending distance and location of the second projection.

3. The apparatus according to claim 2, wherein the arm and the second arm are integrally connected together and pivotally mounted to the base at one end of the arm and of the second arm.

4. The apparatus according to claim 3, wherein the arm is longer than the second arm, the longer portion of the arm being thicker and wider at an end opposite to the one end mounted to the base, the thicker and wider end having an end face for reflecting light from a photosensor.

5. The apparatus according to claim 2, wherein the arm is independently movable with respect to the second arm, each of the arm and the second arm being pivotally mounted to the base at one end of the arm and of the second arm.

6. The apparatus according to claim 5, wherein each of the arm and the second arm is thicker and wider at an end opposite to the one end mounted to the base, the thicker and wider ends each having an end face for reflecting light from a photosensor.

7. The apparatus according to claim 2, wherein said projection and second projection are integrally formed with said arm and said second arm.

8. The apparatus according to claim 7, wherein said arm and second arm having said projection and said second projection, respectively, are die casted from a metal.

9. The apparatus according to claim 8 wherein said metal is an aluminum alloy.

10. The apparatus according to claim 2, wherein said projection and said second projection are fixably connected to said arm and said second arm, respectively.

11. The apparatus according to claim 10, wherein said projection and said second projection are made from a machinable plastic.

12. The apparatus according to claim 10, wherein said projection and said second projection are made from a metal.

13. The apparatus according to claim 12 wherein said metal is an aluminum alloy.

* * * * *